US009685489B2

(12) United States Patent
Shi et al.

(10) Patent No.: US 9,685,489 B2
(45) Date of Patent: Jun. 20, 2017

(54) OLED PIXEL STRUCTURE AND OLED DISPLAY DEVICE

(71) Applicant: BOE TECHNOLOGY GROUP CO., LTD., Beijing (CN)

(72) Inventors: Ling Shi, Beijing (CN); Kazuyoshi Nagayama, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/420,744

(22) PCT Filed: Jun. 30, 2014

(86) PCT No.: PCT/CN2014/081206
§ 371 (c)(1),
(2) Date: Feb. 10, 2015

(87) PCT Pub. No.: WO2015/043269
PCT Pub. Date: Apr. 2, 2015

(65) Prior Publication Data
US 2016/0035807 A1   Feb. 4, 2016

(30) Foreign Application Priority Data

Sep. 27, 2013  (CN) .......................... 2013 1 0451132

(51) Int. Cl.
*H01L 29/08* (2006.01)
*H01L 27/32* (2006.01)
(Continued)

(52) U.S. Cl.
CPC ...... *H01L 27/3262* (2013.01); *H01L 27/3248* (2013.01); *H01L 27/3274* (2013.01);
(Continued)

(58) Field of Classification Search
CPC ............ H01L 27/3262; H01L 27/3274; H01L 27/3276; H01L 27/3248; H01L 29/78672;
(Continued)

(56) References Cited

U.S. PATENT DOCUMENTS

| 7,414,600 | B2 * | 8/2008 | Nathan ................ G09G 3/3233 257/E27.111 |
| 2004/0080470 | A1 * | 4/2004 | Yamazaki ............ G09G 3/3233 345/76 |

(Continued)

FOREIGN PATENT DOCUMENTS

| CN | 1673814 A | 9/2005 |
| CN | 101188246 A | 5/2008 |

(Continued)

OTHER PUBLICATIONS

3rd office action issued in corresponding Chinese application No. 201310451132.1 dated Mar. 17, 2016.

(Continued)

*Primary Examiner* — Allen Parker
*Assistant Examiner* — Wasiul Haider
(74) *Attorney, Agent, or Firm* — Nath, Goldberg & Meyer; Joshua B. Goldberg

(57) ABSTRACT

The present invention belongs to the technical field of display, and specifically relates to an OLED pixel structure and an OLED display device. The OLED pixel structure comprises a thin film transistor and an OLED device, the thin film transistor being provided with a driving electrode for controlling whether the OLED device emits light or not, wherein the pixel structure comprises a transmission region and a reflection region in which a reflection layer formed by extending the driving electrode is provided. The beneficial (Continued)

advantages are that the OLED pixel structure can effectively improve the utilization of the light source and the utilization of the display panel.

20 Claims, 2 Drawing Sheets

(51) Int. Cl.
    *H01L 51/52*     (2006.01)
    *H01L 29/786*    (2006.01)
    *H01L 51/05*     (2006.01)

(52) U.S. Cl.
    CPC ...... *H01L 27/3276* (2013.01); *H01L 29/7869* (2013.01); *H01L 29/78663* (2013.01); *H01L 29/78672* (2013.01); *H01L 51/0512* (2013.01); *H01L 51/5206* (2013.01); *H01L 51/5215* (2013.01); *H01L 51/5234* (2013.01); *H01L 51/5271* (2013.01); *H01L 2251/5315* (2013.01); *H01L 2251/558* (2013.01)

(58) Field of Classification Search
    CPC ........... H01L 29/7869; H01L 29/78663; H01L 51/0512; H01L 51/5206; H01L 51/5234; H01L 51/5215; H01L 51/5271
    See application file for complete search history.

(56) References Cited

U.S. PATENT DOCUMENTS

| | | | |
|---|---|---|---|
| 2005/0213004 A1 | 9/2005 | Sakamoto et al. | |
| 2006/0292763 A1 | 12/2006 | Hwang et al. | |
| 2011/0102407 A1* | 5/2011 | Cho | G02F 1/133308 345/211 |
| 2013/0193843 A1* | 8/2013 | Yan | H05B 33/22 313/504 |
| 2014/0166996 A1* | 6/2014 | Kim | H01L 51/5203 257/40 |
| 2015/0014650 A1* | 1/2015 | Lim | H01L 27/3262 257/40 |

FOREIGN PATENT DOCUMENTS

| | | |
|---|---|---|
| CN | 101783360 A | 7/2010 |
| CN | 103500752 A | 1/2014 |
| CN | 203503662 U | 3/2014 |

OTHER PUBLICATIONS

Search Report issued in International Application No. PCT/CN2014/081206, thirteen (13) pages.
Notification of the First Office Action dated May 28, 2015 corresponding to Chinese application No. 201310451132.1.
Written Opinion of International Searching Authority dated Sep. 23, 2014 corresponding to International application No. PCT/CN2014/081206.

* cited by examiner

OLED PIXEL STRUCTURE AND OLED DISPLAY DEVICE

This is a National Phase Application filed under 35 U.S.C. 371 as a national stage of PCT/CN2014/081206, filed Jun. 30, 2014, and claims priority benefit from Chinese Application No. 201310451132.1, filed Sep. 27, 2013, the content of each of which is hereby incorporated by reference in its entirety.

FIELD OF THE INVENTION

The present invention relates to the technical field of display, and particularly to an OLED pixel structure and an OLED display device.

BACKGROUND OF THE INVENTION

Transparent display is one of the focuses of technology trends recently. As mainstream of the current flat display, A Thin Film Transistor Liquid Crystal Display (TFT-LCD) and an Active Matrix Organic Light-emitting Device (AMO-LED) both can realize transparent display, particularly, the AMOLED has better transparent display effect.

An OLED is a luminescent device in which organic solid-state semiconductor is used as luminescent material. The OLED has a promising application prospect due to its advantages of simple manufacturing process, low cost, low power consume, high luminance, wide range of working temperature, and so on. Compared with a liquid crystal display device, the OLED display device has a thinner and lighter overall structure because OLED devices in an OLED display device are capable of emitting light itself and thus a bulky and heavy backlight in the liquid crystal display device can be omitted. However, in most of AMOLED transparent display technology of the prior art, light is emitted in double-side manner, so that most of light emitted by the light source of OLED devices is not rationally utilized, resulting in lower utilization of the light source.

In addition, in most of AMOLED transparent display devices of the prior art, there are blank windows, each of which is a transparent region arranged in each pixel or in several pixels. That is, in such a region, no OLED device is provided or driven so that normal optical property of the region is kept so as to realize transparent display. Since the region corresponding to the blank window only functions as a transmission region and cannot be effectively utilized to display images, utilization of display panel is low.

SUMMARY OF THE INVENTION

In view of the above shortcomings of the prior art, the present invention provides an OLED pixel structure which can effectively improve utilization of the light source of an OLED device and utilization of a display panel, and an OLED display device.

An OLED pixel structure according to an aspect of the present invention comprises a thin film transistor and an OLED device, the thin film transistor being provided therein with a driving electrode for controlling whether the OLED device emits light or not, wherein the OLED pixel structure comprises a transmission region and a reflection region in which a reflection layer formed by extending the driving electrode is provided.

Preferably, the driving electrode comprises a gate, and a source and a drain which are provided in a same layer, the reflection layer being formed by extending the gate or the drain towards a center of the pixel structure.

Preferably, the OLED device is of top-emitting structure and comprises an anode and a cathode which are arranged opposite to each other; the reflection layer is arranged under the anode and partially overlapped with the anode in a direction of orthographic projection.

Preferably, the reflection layer is formed by using a same material as the gate or the drain.

Preferably, the anode and the cathode are formed by using a transparent electrode material or a metal alloy material having equivalent transparent effect, and the reflection layer is formed by using aluminium, copper, molybdenum, aluminium-neodymium alloy, chromium, titanium, or silver.

Preferably, the reflection layer is formed by using a same patterning process as that for the gate or the drain.

Preferably, the reflection layer has a same thickness as that of the gate or the drain.

Preferably, an area ratio of the reflection layer to the transmission region is 1:1.

Preferably, a structure of the thin film transistor comprises a top-gate structure and a bottom-gate structure, and the thin film transistor is an a-Si thin film transistor, a low temperature poly-silicon thin film transistor, an oxide thin film transistor, or an organic thin film transistor.

An OLED display device according to another aspect of the present invention comprises a plurality of pixel structures, each of which is the above OLED pixel structure.

The beneficial advantages of the present invention are as follows. In the OLED pixel structure according to the present invention, the anode and the cathode of the OLED device of top-emitting structure both are formed by using a transparent electrode material or a metal alloy material having equivalent transparent effect, and the pattern of the metal electrode (the gate or the drain) of the thin film transistor for driving the OLED device is extended so as to serve as the reflection layer of the pixel structure, such that a part of light from the OLED device can be reflected back to the anode to be reused, and thus the utilization of light source of the OLED device in the OLED pixel structure is improved. In addition, the transmission region is formed in a region, in which neither a thin film transistor nor a reflection layer is formed, in the pixel structure of the present invention. The transmission region can be used for displaying background images and realizing transparent display. Therefore, compared with the OLED pixel structure in the prior art, the OLED pixel structure of the present invention has the area of a blank window reduced and the utilization of display panel improved.

REFERENCE NUMERALS

Figure 1:
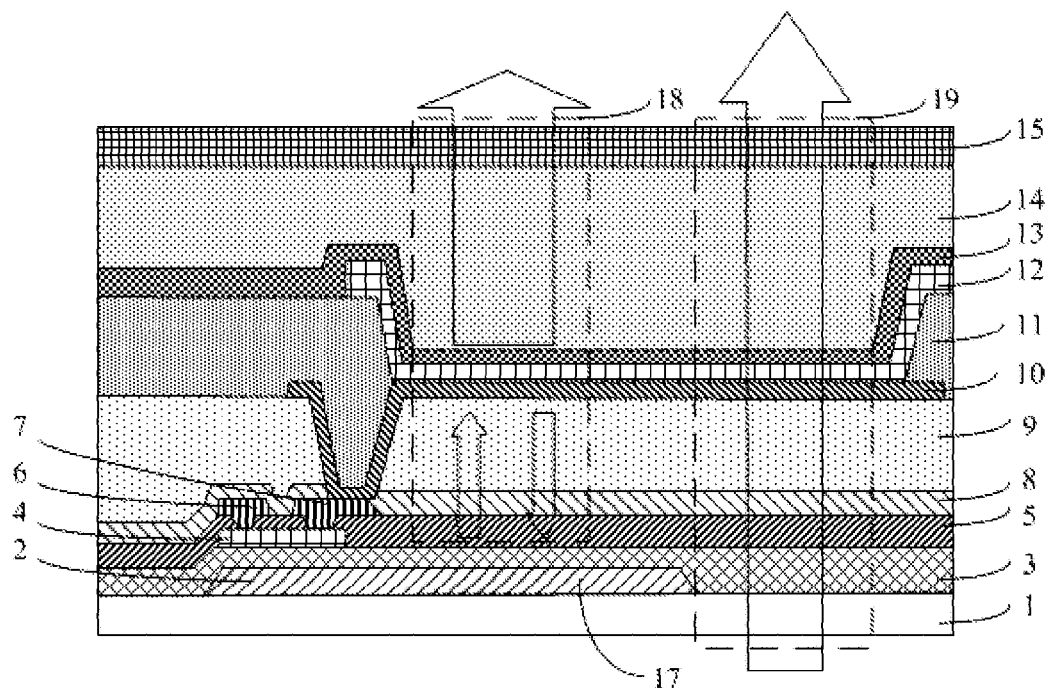
FIG. 1 is a sectional view of an OLED pixel structure in a first embodiment of the present invention.

1—substrate; 2—gate; 3—gate insulation layer; 4—active layer; 5—etch stopping layer; 6—source; 7—drain; 8—passivation layer; 9—resin layer; 10—anode; 11—pixel definition layer; 12—light-emitting layer; 13—cathode;

14—encapsulation layer; 15—package substrate; 16—through via; 17—reflection layer; 18—reflection region; 19—transmission region.

DETAILED DESCRIPTION OF THE EMBODIMENTS

In order that a skilled person in the art may fully understand the technical solutions of the invention, a partial top view of an OLED pixel structure and an OLED display device of the invention are described below in detail in conjunction with the accompanying drawings along with specific embodiments. It should be understood that layers, portions, devices and so on in the drawings are not depicted in actual proportion as a matter of convenience. Further, in order to clearly show position relationships between the layers in the pixel structure of the embodiments of the invention, the proportions of the layers are slightly different between top views (FIG. 2 for illustrating the first embodiment and FIG. 4 for illustrating the second embodiment) and corresponding sectional views (FIG. 1 for illustrating the first embodiment and FIG. 3 for illustrating the second embodiment), and the layers in the top views are depicted as having a certain transparency.

The present invention provides an OLED pixel structure which comprises a thin film transistor and an OLED device, the thin film transistor being provided with a driving electrode for controlling whether the OLED device emits light or not, wherein the OLED pixel structure comprises a transmission region and a reflection region, and a reflection layer formed by extending the driving electrode is provided in the reflection region. The present invention further provides an OLED display device comprising a plurality of the above OLED pixel structures.

First Embodiment

In the thin film transistor of the pixel structure of the present embodiment, the driving electrode comprises a gate, and a source and a drain which are provided in a same layer, the reflection layer being formed by extending the gate towards a center of the pixel structure. The reflection layer may be formed by using a same material as the gate, and thickness of the reflection layer may be equal to that of the gate.

Preferably, the OLED device is of top-emitting structure, that is, light from the OLED device is emitted from bottom to top of the OLED device. The OLED device comprises an anode and a cathode which are arranged opposite to each other. Both the anode and the cathode are formed by using transparent material or metal alloy material with equivalent transparent effect. The reflection layer is arranged under the anode and partially overlapped with the anode in a direction of orthographic projection.

Figure 2:
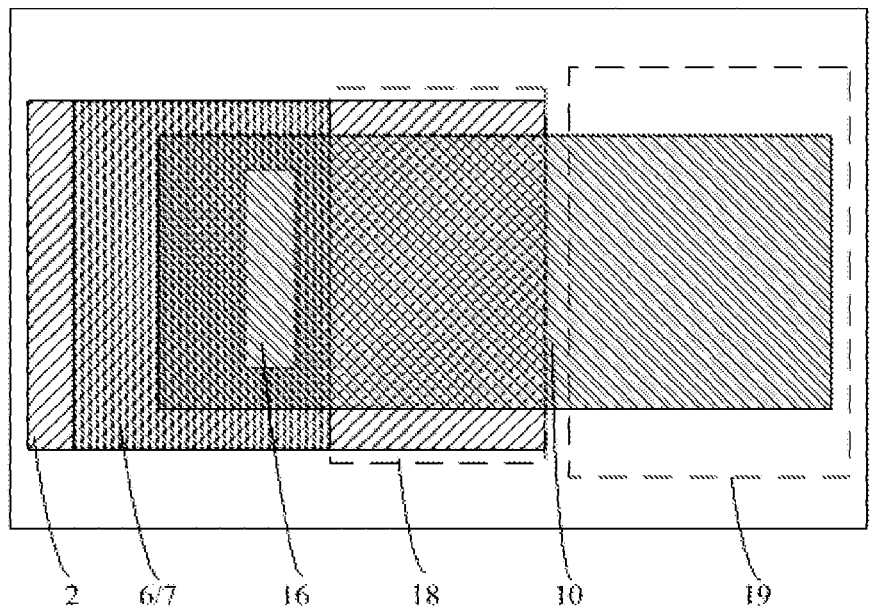
FIG. 2 is a top view of the OLED pixel structure in FIG. 1.

As shown in FIGS. 1 and 2, in the present embodiment, as an example of a pixel structure in which the OLED device is driven by a bottom-gate type thin film transistor, the thin film transistor comprises a gate 2, a gate insulation layer 3, an active layer 4, an etch stopping layer 5, a source 6 and a drain 7 which are arranged in a same layer, a passivation layer 8 and a resin layer 9 sequentially arranged on a substrate 1. The gate 2 is formed to extend towards the center of the pixel structure so as to form the reflection layer 17. An anode 10 of the OLED device is arranged over the resin layer 9, and electrically connected with the drain 7 through a through via 16 in the passivation layer 8 and the resin layer 9 (i.e., a through via formed in the passivation layer 8 and the resin layer 9 to make the drain 7 contact with the anode 10; the through via in FIG. 1 is not marked with a reference number since the through via has been filled with anode material). A pixel definition layer (PDL) 11, a light emitting layer (EL) 12 and a cathode 13 are sequentially arranged over the anode 10. The pixel structure is encapsulated by an encapsulation layer 14 and a package substrate 15 sequentially arranged over the cathode 13. The package substrate 15 can effectively prevent encapsulation material from being damaged, and thus results in better packaging effect.

Preferably, the reflection layer 17 is formed by a same material as the gate 2, e.g., both of them are formed by using aluminium, copper, molybdenum, aluminium-neodymium alloy, chromium, titanium, or silver. The thickness of the reflection layer is equal to that of the gate 2, e.g., ranges from 200 to 300 nm. The area of the reflection layer 17 may be about ½ of the area of light-emitting region of pixel. The anode 10 and the cathode 13 of the OLED device is formed by a transparent electrode material or a metal alloy material having equivalent transparent effect, e.g., the anode is formed by transparent Indium Tin Oxide (ITO), and the cathode is formed by very thin (for example, 10 to 50 nm) Mg—Ag alloy film such that opaque Mg—Ag alloy material can achieve transparent effect. In practical process, it should be take into account matching between work functions of the anode and the cathode of the OLED device, and it is unnecessary to go into details herein.

In the present embodiment, as shown in FIG. 2, a region corresponding to the reflection layer 17 in the pixel structure forms a reflection region 18. Other region, except for the reflection region 18 and a region in which the thin film transistor is located, in the pixel structure forms a transmission region 19. Preferably, an area ratio of the reflection region to the transmission region is 1:1. Obviously, in order to ensure that images can be normally displayed and reuse of light source of the OLED device can be optimized, an optimal area ratio of the reflection region to the transmission region may be obtained by experimental simulation or multiple measurements of samples.

In the present embodiment, the thin film transistor may be an a-Si thin film transistor, a Low Temperature Poly-Silicon (LTPS) thin film transistor, an oxide thin film transistor, or an organic thin film transistor.

In a fabricating procedure of the pixel structure, the reflection layer 17 and the gate 2 may be formed by a same patterning process. The patterning process generally comprises photoresist application, exposure, developing, etching, photoresist stripping, and so on. Specifically, the gate 2 of the thin film transistor is formed on the substrate 1 such that the pattern of the gate 2 extends into a part of a region, in which the anode of the OLED device will be formed, so as to serve as the reflection layer 17 (the reflection layer 17 is located under the anode which will be formed later); next, other layers comprising the gate insulation layer 3, the active layer 4, the etch stopping layer 5, the source 6 and the drain 7 arranged in a same layer, the passivation layer 8 and the resin layer 9 are sequentially formed over the gate 2 and the reflection layer 17, until the fabrication of the thin film transistor is finished. Since structures and fabrication processes for other layers except for the gate/reflection layer in the thin film transistor may be the same as those in the prior art, respectively, detailed description for them will be omitted herein.

After the thin film transistor is formed, the OLED device is formed over the thin film transistor. In the process for forming the OLED, at first, the anode 10 is formed by using a transparent electrode material or a metal alloy material having equivalent transparent effect, next, the pixel definition layer 11 and the light-emitting layer 12 are sequentially finished according to structures and processes of the prior art, then the cathode 13 is formed by using a transparent electrode material or a metal alloy material having equivalent transparent effect, and finally, the encapsulation layer 14 and the package substrate 15 are sequentially formed to complete packaging of the pixel structure. Obviously, a specific structure of the OLED device may not be limited to the above structure, but may be of other structure or comprise other auxiliary layers (e.g., an electron blocking layer, a hole injection layer, and so on). Since structures and fabrication processes for the layers in the OLED device may be the same as those in the prior art, respectively, detailed description for them will be omitted herein.

In the pixel structure of the present embodiment, the OLED device is of top-emitting type, the gate 2 is formed by using material with good reflectivity such as aluminium, copper, molybdenum, aluminium-neodymium alloy, chromium, titanium, or silver, and the gate 2 is formed to extend to under the anode of the OLED device to serve as the reflection layer 17 of the OLED device for reflecting light emitted from the light source of OLED device. Therefore, at the time when the reflection region is displaying images, a part of light, which is emitted downward from the OLED device, can be reflected by the reflection layer 17 back to the anode, so that the utilization of light source of the OLED device is improved.

In addition, in the pixel structure of the present embodiment, the anode and the cathode are formed by using a transparent electrode material or a metal alloy material having equivalent transparent effect. Thus, a transmission region, in which neither a thin film transistor nor a reflection layer is formed, in the pixel structure is formed, so that background images can be displayed by the transmission region, and thus transparent display is achieved.

Compared with the pixel structure in the prior art, the pixel structure of the present invention provides the reflection region and the transmission region formed in a region corresponding to the blank window of the prior art, resulting in reduced blank window and improved utilization of display panel.

The pixel structure is modified slightly in the embodiment, i.e., the pattern of the metal electrode in the thin film transistor is appropriately changed so as to further function as the reflection layer of the top-emitting type of OLED device. Thus, other components except the metal electrode in the pixel structure may still be fabricated according to the prior art, and thereby the cost for such change is small.

Second Embodiment

In the pixel structure of the first embodiment, the driving electrode of the thin film transistor comprises the gate, and the source and the drain arranged in a same layer, and the gate extends to the center of the pixel structure to form the reflection layer 17. Unlike the first embodiment, in the pixel structure of the present embodiment, the reflection layer is formed by extending the drain to the center of the pixel structure. The reflection layer may be formed by using the same material of the drain, and the thickness of the reflection layer may be equal to that of the drain.

In the present embodiment, the OLED device may still be of top-emitting structure, and the anode and the cathode arranged opposite to each other are formed by using a transparent electrode material or a metal alloy material having equivalent transparent effect. The reflection layer is arranged under the anode and partially overlapped with the anode in a direction of orthographic projection.

Figure 3:
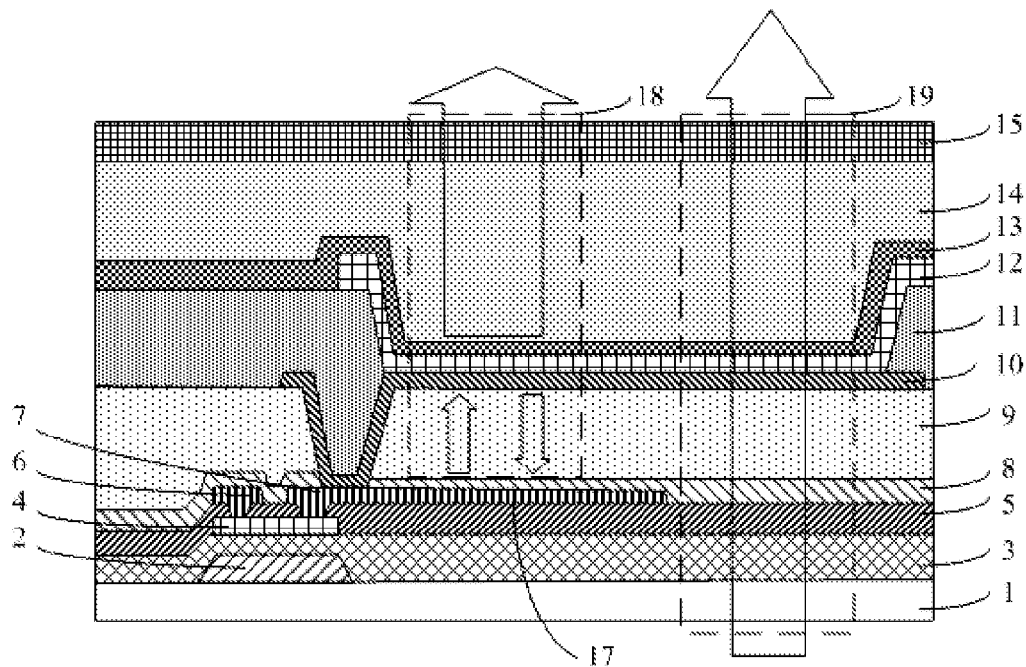
FIG. 3 is a sectional view of an OLED pixel structure in a second embodiment of the present invention.

As shown in FIG. 3, in the present embodiment, as an example of a pixel structure in which the OLED device is driven by a bottom-gate type thin film transistor, the thin film transistor comprises a gate 2, a gate insulation layer 3, an active layer 4, an etch stopping layer 5, a source 6 and a drain 7 which are arranged in a same layer, a passivation layer 8 and a resin layer 9 sequentially arranged on a substrate 1. The gate 7 is formed to extend towards the center of the pixel structure so as to form a reflection layer 17. An anode 10 of the OLED device is arranged over the resin layer 9, and electrically connected with the drain 7 through a through via 16 in the passivation layer 8 and the resin layer 9. A pixel definition layer 11, a light emitting layer 12 and a cathode 13 are sequentially arranged over the anode 10. The pixel structure is encapsulated by an encapsulation layer 14 and a package substrate 15.

Preferably, the reflection layer 17 is formed by the same material as the drain 7, e.g., both of them are formed by using aluminium, copper, molybdenum, aluminium-neodymium alloy, chromium, titanium, or silver. The thickness of the reflection layer 17 is equal to that of the drain 7, e.g., ranges from 200 to 300 nm.

Figure 4:
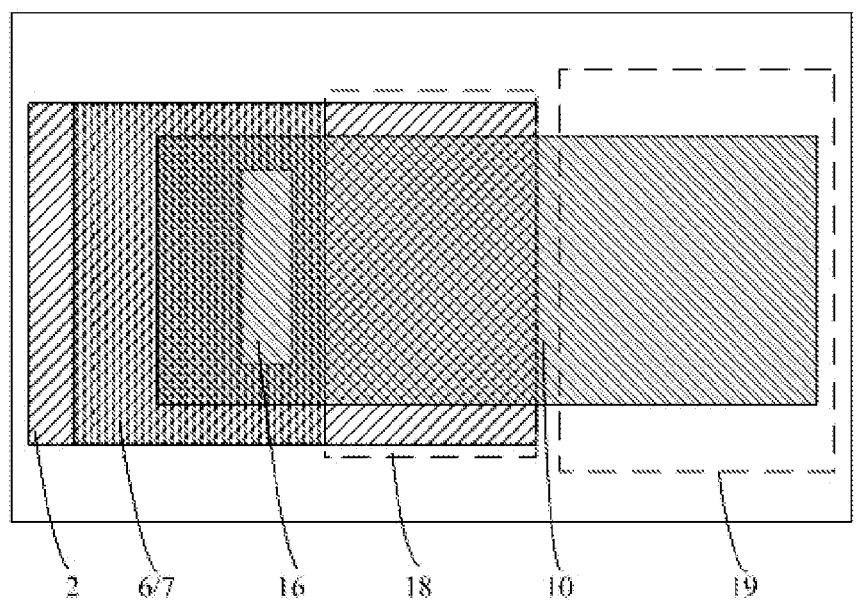
FIG. 4 is a top view of the OLED pixel structure in FIG. 3.

In a fabricating procedure of the pixel structure, the reflection layer 17 and the drain 7 may be formed by a same patterning process. Specifically, the gate 2, the gate insulation layer 3, the active layer 4, the etch stopping layer 5, the source 6 and the drain 7 arranged in a same layer of the thin film transistor is formed on the substrate 1. During the formation of the drain 7, the pattern of the drain 7 is formed to extend into a part of a region, in which the anode of the OLED device will be formed, so as to serve as the reflection layer 17 (the reflection layer 17 is located under the anode which will be formed later); next, other layers such as the passivation layer 8 and the resin layer 9 are sequentially formed over the drain 7 and the reflection layer 17, until the fabrication of the thin film transistor is finished. Similar to the first embodiment, in the pixel structure of the present embodiment, as shown in FIG. 4, a region of the pixel structure corresponding to the reflection layer 17 is the reflection region 18, and other region in the pixel structure except the reflection region 18 and a region in which the thin film transistor is located forms the transmission region 19.

After the thin film transistor is formed, the OLED device is formed over the thin film transistor. In the process for forming the OLED, at first, the anode is formed by using a transparent electrode material or a metal alloy material having equivalent transparent effect, next, the pixel definition layer 11 and the light-emitting layer 12 are sequentially finished according to structures and processes of the prior art, then the cathode 13 is formed by using a transparent electrode material or a metal alloy material having equivalent transparent effect, and finally, the encapsulation layer 14 and the package substrate 15 are formed to complete packaging of the pixel structure.

Similar to the first embodiment, in the pixel structure of the present embodiment, the OLED device is of top-emitting type, the anode of the OLED device is formed by using a transparent electrode material or a metal alloy material having equivalent transparent effect, and the drain 7 is formed by using a material with good reflectivity to extend to under the anode of the OLED device to serve as the reflection layer 17. Therefore, a reflection region is formed in a region in the pixel structure corresponding to the reflection layer, thereby, a part of light, which is emitted downward from the OLED device, can be reflected by the reflection layer 17 back to the anode, so that the utilization of light source of the OLED device is improved. In addition, a transmission region is formed in a region of the pixel structure, in which neither a thin film transistor nor a reflection layer is formed, so that background images can be displayed by the transmission region, that is, transparent display is achieved. Compared with the pixel structure in the prior art, the pixel structure of the present embodiment provides the reflection region and the transmission region formed in a region corresponding to the blank window of the prior art, resulting in reduced blank window and improved utilization of display panel.

Third Embodiment

The present embodiment is different from the first and the second embodiments in that, in the pixel structure of the present embodiment, the thin film transistor is of top-gate type structure. The source, the drain and the active layer of the top-gate type thin film transistor are arranged under the gate.

Similar to the first and the second embodiments, in the pixel structure of the present embodiment, the gate or the drain also may be formed to extend towards the center of the pixel structure so as to form a reflection layer. The function of the reflection layer in the pixel structure of the present embodiment is the same as that of the reflection layer of the first or the second embodiment, and thus the utilization of light source of the OLED device can also be improved. In addition, in the pixel structure of the present embodiment, the anode of the OLED device is also formed by using a transparent electrode material or a metal alloy material having equivalent transparent effect, so that a transmission region being capable of achieving transparent display is formed in a region of the pixel structure in which neither a thin film transistor nor a reflection layer is formed. Therefore, compared with the pixel structure in the prior art, the pixel structure of the present embodiment provides the reflection region and the transmission region formed in a region corresponding to the blank window of the prior art, resulting in reduced blank window and improved utilization of display panel.

It should be understood that, although the embodiments of the present invention are described by taking the structures of the thin film transistors and the OLED devices of the array substrates as schematically shown in FIGS. 1 to 4 as examples, a structure of the thin film transistor and the OLED device should not be limited to the above structures. The essential idea of the present invention lies in that, the metal electrode of the thin film transistor (a driving electrode, such as the gate or the drain in the embodiments) is formed to extend in plane such that the metal electrode can function as a reflection layer in the pixel structure while it fulfils its own function of driving, and thus the target of further improving the utilization of light source of the OLED device is achieved.

Fourth Embodiment

The present embodiment provides an OLED display device comprising a plurality of pixel structures, each of which may be any one of the OLED pixel structures as described in the above first to third embodiments. The display device may be any product or component with display function, such as electronic paper, a mobile telephone, a tablet computer, a television set, a display, a notebook PC, a digital album, a navigator, and so on.

The present invention provides an OLED pixel structure, in which the OLED device is of top-emitting structure, the anode and the cathode of the OLED device both are formed by using a transparent electrode material or a metal alloy material having equivalent transparent effect, and the pattern of the metal electrode (the gate or the drain) of the thin film transistor for driving the OLED device is extended so as to serve as the reflection layer of the pixel structure. Thus, the pixel structure comprises a reflection region and a transmission region. On one hand, the reflection region can reflect a part of light from the OLED device back to the anode to be reused while displaying images, and thus the utilization of light source of the OLED device in the OLED pixel structure is improved. Especially compared with double-emitting OLED transparent display technology, the OLED device in the OLED pixel structure has much higher utilization of light source. On the other hand, the transmission region can used for displaying background images when the pixel structure is not in working time or the OLED device emits dim light, and thus transparent display is achieved.

Compared with the pixel structure in the prior art, the pixel structure of the present embodiment provides the reflection region and the transmission region formed in a region corresponding to the blank window of the prior art, resulting in reduced blank window and improved utilization of display panel. Also, the OLED display device comprising the pixel structure of the present invention has the above technical effects.

It can be understood that the above embodiments are only exemplary embodiments for illustrating the principle of the present invention; however, the present invention is not limited thereto. As for a person having ordinary skill in the art, various variations and improvements can be made without departing from the spirit and essence of the present invention, and these variations and improvements should be considered to be fallen within the protection scope of the present invention.

The invention claimed is:

1. An OLED pixel structure, comprising a thin film transistor and an OLED device, the thin film transistor being provided therein with a driving electrode for controlling whether the OLED device emits light or not,
   wherein the OLED pixel structure comprises a transmission region, and a reflection region in which a reflection layer formed by extending the driving electrode is provided,
   wherein the reflection layer is integrated with and disposed at a same layer as the driving electrode, and
   wherein the transmission region of the OLED pixel structure is capable of transmitting ambient light, and the reflection region is capable of reflecting ambient light so that ambient light outgoes from a single side of the OLED pixel structure.

2. The OLED pixel structure of claim 1, wherein the driving electrode comprises a gate, or a source and a drain which are provided in a same layer, the reflection layer being formed by extending the gate or the drain towards a center of the pixel structure.

3. The OLED pixel structure of claim 2, wherein the OLED device is of top-emitting structure and comprises an anode and a cathode which are arranged opposite to each other; the reflection layer is arranged under the anode and partially overlapped with the anode in a direction of orthographic projection.

4. The OLED pixel structure of claim 3, wherein the reflection layer is formed by using a same material as the gate or the drain.

5. The OLED pixel structure of claim 4, wherein the anode and the cathode are formed by using a transparent electrode material or a metal alloy material having equivalent transparent effect, and the reflection layer is formed by using aluminum, copper, molybdenum, aluminum-neodymium alloy, chromium, titanium, or silver.

6. The OLED pixel structure of claim 5, wherein the reflection layer is formed by using a same patterning process as that for the gate or the drain.

7. The OLED pixel structure of claim 6, wherein the reflection layer has a same thickness as that of the gate or the drain.

8. The OLED pixel structure of claim 7, wherein an area ratio of the reflection layer to the transmission region is 1:1.

9. The OLED pixel structure of claim 2, wherein an area ratio of the reflection layer to the transmission region is 1:1.

10. The OLED pixel structure of claim 3, wherein an area ratio of the reflection layer to the transmission region is 1:1.

11. The OLED pixel structure of claim 4, wherein an area ratio of the reflection layer to the transmission region is 1:1.

12. The OLED pixel structure of claim 5, wherein an area ratio of the reflection layer to the transmission region is 1:1.

13. The OLED pixel structure of claim 6, wherein an area ratio of the reflection layer to the transmission region is 1:1.

14. The OLED pixel structure of claim 1, wherein an area ratio of the reflection layer to the transmission region is 1:1.

15. An OLED display device comprising a plurality of pixel structures, wherein each of the pixel structures is the OLED pixel structure of claim 1.

16. The OLED display device of claim 15, wherein the driving electrode comprises a gate, or a source and a drain which are provided in a same layer, the reflection layer being formed by extending the gate or the drain towards a center of the pixel structure.

17. The OLED display device of claim 16, wherein the OLED device is of top-emitting structure and comprises an anode and a cathode which are arranged opposite to each other; the reflection layer is arranged under the anode and partially overlapped with the anode in a direction of orthographic projection.

18. The OLED display device of claim 17, wherein the reflection layer is formed by using a same material as the gate or the drain.

19. The OLED display device of claim 18, wherein the anode and the cathode are formed by using a transparent electrode material or a metal alloy material having equivalent transparent effect, and the reflection layer is formed by using aluminum, copper, molybdenum, aluminum-neodymium alloy, chromium, titanium, or silver.

20. The OLED pixel structure of claim 1, wherein the reflection layer is formed by contiguously extending the driving electrode.

* * * * *